United States Patent [19]

Nesbit et al.

[11] Patent Number: 4,603,926

[45] Date of Patent: Aug. 5, 1986

[54] CONNECTOR FOR JOINING MICROSTRIP TRANSMISSION LINES

[75] Inventors: Gerald H. Nesbit, Voorhees Township, Camden County; Alireza Afrashteh, Colts-Neck, both of N.J.

[73] Assignee: RCA Corporation, Princeton, N.J.

[21] Appl. No.: 566,905

[22] Filed: Dec. 29, 1983

[51] Int. Cl.[4] .................... H05K 1/00

[52] U.S. Cl. .................... 339/17 C; 339/17 M; 339/177 R

[58] Field of Search .................... 339/177, 17 C, 17 LM, 339/17 M, 17 LC, 143, 278 C

[56] References Cited

U.S. PATENT DOCUMENTS

| | | | |
|---|---|---|---|
| 2,869,090 | 1/1959 | Johanson | 339/17 C |
| 3,368,112 | 2/1968 | Hellgren | 339/17 C |
| 3,688,635 | 9/1972 | Fegen | 85/5 R |
| 3,760,329 | 9/1973 | Stepan | 339/177 R |
| 3,772,632 | 11/1973 | Ratcliff et al. | 339/278 C |
| 3,818,278 | 6/1974 | Adler | 339/143 R |
| 3,836,935 | 9/1974 | Johnson | 339/17 LM |
| 4,012,095 | 3/1977 | Doucet et al. | 339/17 C |
| 4,218,724 | 8/1980 | Kaufman | 339/17 M |
| 4,231,629 | 11/1980 | Kirby | 339/17 C |
| 4,412,717 | 11/1983 | Monroe | 339/177 R |
| 4,431,253 | 2/1984 | Hochgesang et al. | 339/177 R |
| 4,453,796 | 6/1984 | Monroe | 339/177 R |

OTHER PUBLICATIONS

"Miniature Systems Products Catalog No. 204A" of Cableware Miniature Products Company, Wallingford, Conn. 06492.

*Primary Examiner*—Gil Weidenfeld
*Assistant Examiner*—David L. Pirlot
*Attorney, Agent, or Firm*—Joseph S. Tripoli; Robert L. Troike; Robert Ochis

[57] ABSTRACT

Two microstrip transmission line substrates are mounted face-to-face at a fixed separation determined by mating connector halves which provide microstrip to coaxial transmission line transitions. Each connector half includes a body portion, a stand-off portion and a coaxial connector portion.

12 Claims, 7 Drawing Figures

CONNECTOR FOR JOINING MICROSTRIP TRANSMISSION LINES

BACKGROUND OF THE INVENTION

The present invention is directed to the field of microstrip transmission lines and more particularly to the field of connectors for connecting microstrip transmission lines together.

Strip transmission lines of the type having a substrate with a relatively narrow strip conductor on a face side thereof and a relatively broad ground conductor on a back side thereof are known as microstrip transmission lines. For the microstrip transmission lines to function in accordance with theory, the relatively broad ground conductor must be at least about three times as wide as the relatively narrow strip conductor. Connectors for connecting microstrip transmission lines to coaxial transmission lines are commerically available which are designed to be mounted on the backside of the microstrip transmission line. These connectors have inner conductors which extend from the coaxial connector portion of the connector through the microstrip transmission line substrate to make electrical contact with a relatively narrow strip conductor on the face of the microstrip transmission line.

A need has developed in the radar field for compact, light weight beamformers and other microwave circuitry. Microstrip transmission lines are themselves light weight and reasonably compact. Beamforming circuitry for phased array radars is complex and extensive. In order to provide beamforming circuitry in a sufficiently compact form for use in these radars, microstrip transmission lines must be placed in close proximity to each other. Presently available connection techniques do not permit a sufficiently compact and light weight structure to be fabricated with the required electrical performance.

There is a need for a connection technique which enables beamformers and other complex circuitry to be fabricated in a high performance, light weight, compact microwave structure.

SUMMARY OF THE INVENTION

The present invention is a system which meets this need. A connector half for use with a mating connector half and a strip transmission line of the type having a dielectric substrate with a relatively narrow strip conductor on a face side thereof and a relatively broad ground conductor on a back side thereof has a body portion, a stand-off portion, and a coaxial connector portion. The coaxial connector portion includes an inner conductor and an outer conductor. The inner conductor extends from within the coaxial connector portion through and beyond the body portion for making contact with the narrow strip conductor on the substrate. The stand-off portion is for spacing the body portion a predetermined distance from the strip transmission line substrate to provide a dielectric region surrounding the inner conductor between the body portion and the strip transmission line substrate. For conduction of signals between a microstrip transmission line on one substrate and a microstrip transmission line on another substrate, mating connector halves may be mounted on the face sides of both microstrip transmission line substrates for connection with the two microstrip transmission line substrates disposed face-to-face.

DETAILED DESCRIPTION OF THE PREFERRED EMBODIMENT

Figure 1:
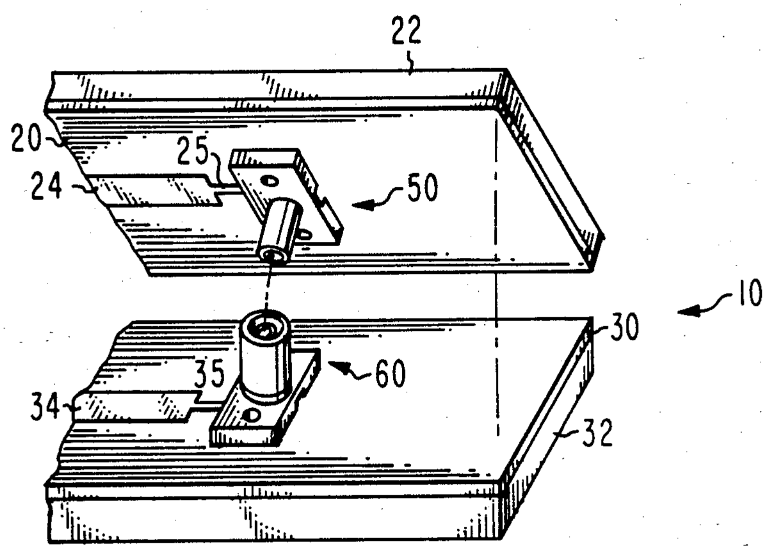
FIG. 1 is an assembly view of connector halves in accordance with the present invention mounted on microstrip transmission line substrates.

A preferred embodiment of the present invention is illustrated generally at 10 in FIG. 1 in an assembly view. First and second microstrip transmission line substrates 20 and 30, respectively, are mounted in face-to-face relation with their planar ground conductors 22 and 32, respectively, outward. The first microstrip transmission line substrate 20 has a male connector half 50 mounted thereon and electrically connected to a microstrip transmission line comprised of the relatively broad ground conductor 22 on the back side of the substrate 20 and the relatively narrow strip conductor 24 on the face side of the substrate 20. The second microstrip transmission line substrate 30 has a female connector half 60 mounted thereon and electrically connected to a microstrip transmission line comprised of the relatively broad ground conductor 32 on the back side of the substrate 30 and the relatively narrow strip conductor 34 on the face side of the substrate 30.

Figure 2:
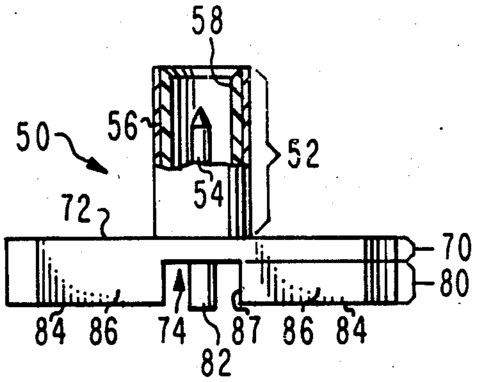
FIGS. 2 and 3 are partially cutaway elevation illustrations of male and female connector halves, respectively, in accordance with one embodiment of the present invention.
Figure 3:
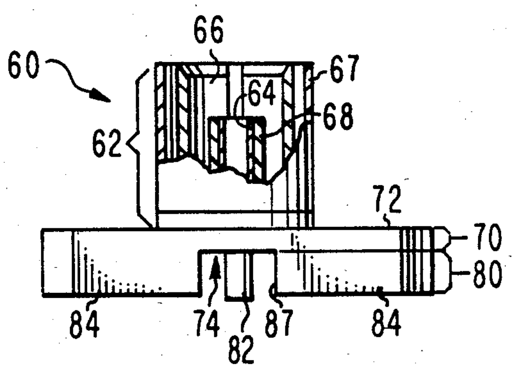

Each connector half has a similar basic structure which is shown in elevation in FIGS. 2 and 3. This basic structure comprises either a male coaxial connector portion 52 for the connector half 50 (FIG. 2) or a female coaxial connector portion 62 for the connector half 60 (FIG. 3), a body portion 70 adjacent the connector portion and a stand-off portion 80 adjacent the body portion except in the center region thereof where a gap 75 is provided.

Figure 4:
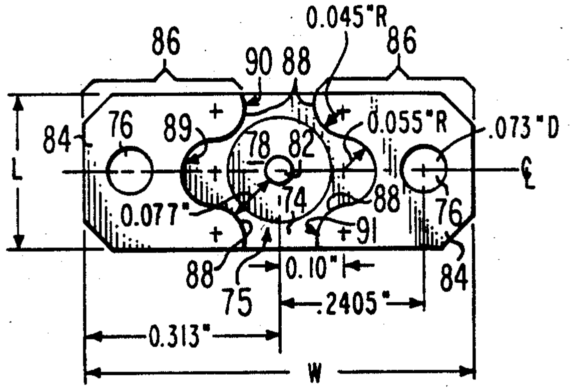
FIG. 4 is a bottom view of a connector half in accordance with the present invention.

Body portion 70 has the same structure in both the male connector half and the female connector half. This structure is discussed in terms of the connector half 50 which is mounted on substrate 20. A lower surface 74 of body 70 adjacent the gap 75 faces the microstrip transmission line substrate 20. An upper body surface 72 faces away from the strip transmission line substrate 20. In the bottom view in FIG. 4, the body portion 70 has a generally rectangular outline and has side-to-side and top-to-bottom symmetry. In a connector half for use in the 1.0 to 1.5 GHz frequency range, this rectangle has a width W of 0.626 inch (1.59 cm) and a length L of 0.250 inch (0.635 cm).

Two through holes 76 extend from the upper surface 72 of the body through the body portion and the stand-off portion to the substrate. The part of the stand-off portion through which the holes 76 pass may be considered a mounting flange, since it serves to secure the connector half to a substrate. For use at an operating frequency in the range of 1.0 to 1.5 GHz the surface 74 of the body portion which is toward the substrate is preferably spaced (the gap 75) 0.075 inch (0.191 cm) from the face surface of the microstrip transmission line substrate on which it is mounted. This spacing or gap 75 is provided by the stand-off portion 80 which extends from the body portion toward the microstrip transmission line substrate and has a substrate contact surface 84 which is located 0.075 inch (0.191 cm) from body surface 74.

For optimum electrical performance the connector half 50 or 60 must be electrically matched to the microstrip transmission line to which it is connected. Such matching is provided by the stand-off portion 80 in combination with an inner conductor 82, the lower surface 74 of the body portion and the conductor configuration on the substrate. This structure comprises an intermediate RF transmission line which couples the coaxial connector portion 52 or 62 to the microstrip transmission line structure. The inner conductor 82 is an extension of the inner conductor of the coaxial connector portion to be discussed later. The stand-off portion 80 has two spaced apart legs 86 which have inward facing surfaces 87 which comprise a portion of the lateral boundary of the gap 75.

The configuration of the surfaces 87 is designed to contribute to the impedance match. Inner conductor 82 has a diameter of 0.038 inch (0.097 cm) and a length body surface 74 of 0.085 inch (0.216 cm). Thus, inner conductor 82 extends 0.010 inch (0.0254 cm) beyond the substrate contact surface 84 of stand-off legs 86. The inner surfaces 87 of the stand-off legs 86 are contoured to include portions 88 which are nearest to the inner conductor and spaced 0.077 inch (0.196 cm) therefrom and portions 89 (FIG. 4) which are farther from the inner conductor and spaced up to 0.155 inch (0.394 cm) from the center of the inner conductor 82. Each inner surface 87 preferably comprises three contiguous semicylindrical surfaces 89, 90, and 91 which appear in the view of FIG. 4 as semicircles. Each semicylindrical surface 89 is centered with respect to the length L of body 70 and is between surfaces 90 and 91. The surface 89 is concave with respect to inner conductor 82 with the center of curvature of the surface 89 at a point on the body centerline which is 0.10 inch (0.254 cm) from the center of inner conductor 82. This semicylindrical surface has a radius of 0.055 inch (0.140 cm). Each of the four semicylindrical surfaces 90 and 91 on which one of the surface portions 88 is located is oriented convex with respect to the inner conductor 82 and has a radius of curvature of 0.045 inch (0.114 cm) that is centered at a different one of the four corners of a square whose center is at the center of inner conductor 82. This square has sides which are 0.20 inch (0.508 cm) long. Two of those sides are disposed parallel to the body centerline which extends through both holes 76 in FIG. 4. The contours of these surfaces 87 aid in impedance matching the connector half to the microstrip transmission line on which it is mounted.

The coaxial connector portion 52 (or 62) of the connector half 50 (or 60) extends upward from upper surface 72 of the body portion in the partially cutaway elevations in FIGS. 2 and 3. The male and female coaxial connector portions of this connector system are configured to provide a 50 ohm impedance and to intermesh to provide reliable electrical and mechanical connections between the two microstrip transmission line substrates. These coaxial connector portions may be purchased from Cableware Miniature Products Company of Wallingford, Conn. 06492. The commercially available male coaxial connector portion is an integral part of a straight jack which is sold under the part number 700532. The commercially available female coaxial connector portion is an integral part of a straight plug which is sold under the part number 700534. The inner conductor 64 of the female connector portion is a split cylindrical shell which has an inner diameter of about 0.02 inch (0.051 cm). The inner conductor 54 of the male coaxial connector portion is a solid cylinder and has an outer diameter of about 0.02 inch (0.051 cm) and is designed for insertion into the female inner conductor 64 with rubbing contact to ensure the creation of a sound electrical connection. The outer conductor 66 of the female coaxial connector portion 62 is a split cylindrical shell having an inner diameter of about 0.146 inch (0.371 cm) positioned within and spaced from a larger cylindrical shell 67 by an air gap 69. The outer conductor 56 of the male connector portion 50 is a cylindrical shell having an inner diameter of about 0.120 inch (0.30 cm) and an outer diameter of about 0.143 inch (0.36 cm) which is designed to cause rubbing contact with the inner surface of the outer female conductor 66 during insertion of the male connector half into the female connector half. A layer 68 of electrically insulating material having an outer diameter of 0.079 inch (0.20 cm) is disposed on the outer surface of the inner female conductor 64. A layer 58 of electrically insulating material having an inner diameter of 0.083 inch (0.21 cm) is disposed adjacent the inner surface of the outer male conductor 56. Layers 58 and 68 are Teflon and together electrically insulate the inner conductors from the outer conductors and maintain the desired 50 ohm impedance. The rubbing contact between conductors on insertion of the connector halves ensures creation of reliable electrical connections between the mating conductors of the two connector halves.

The inner conductor 82 in the stand-off portion of each of the connector halves 50 and 60 is electrically continuous with the inner conductor 54 or 64 of the coaxial connector portion of that connector half. Preferably, the inner conductor 54 and the inner conductor 82 of connector half 50 comprise parts of the same member. Similarly, the inner conductor 64 and the inner conductor 82 of connector half 60 comprise parts of the same member. Such an inner conductor member is secured in the body portion of the connector half by a dielectric member 78 (shown only in FIG. 4) which spaces the inner conductor 82 from the outer portion of body portion 70 which is connected to ground. The outer conductor of the coaxial connector portion, the outer portion of the body portion and the stand-off portion of a connector half preferably comprise a single integral electrically conductive brass member.

Figure 5:
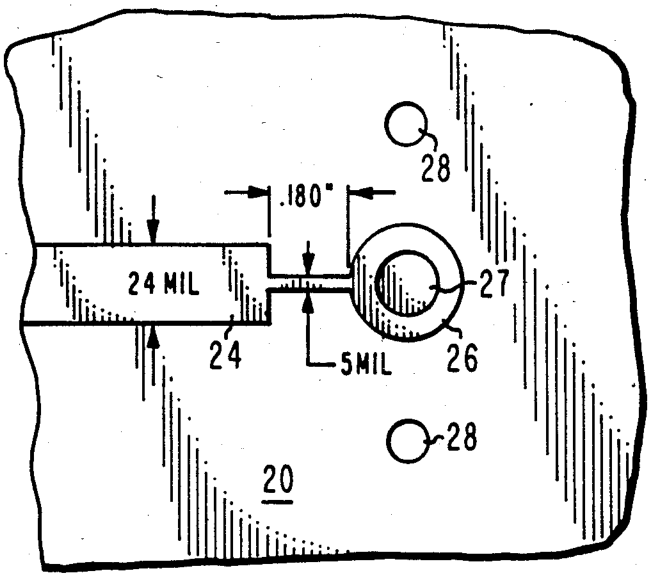
FIG. 5 is a plan view of a microstrip transmission line substrate prior to placement of the connector half.

Achieving a good impedance match between the microstrip transmission line and the connector half 50 or 60 requires proper shaping of both the connector half and the conductive material on the face of the microstrip transmission line substrate. A preferred configuration for the region of the substrate 20 where the connector half 50 is to be mounted is shown in plan view in FIG. 5. The substrate 30 is not shown in detail, but is similar to substrate 20 with the relatively narrow strip conductor portions 34, 35, and 36 on substrate 30 corresponding to the relatively narrow strip conductor portions 24, 25, and 26, respectively, on substrate 20. The relatively narrow strip conductor 24 has a width of 0.024 inch (0.061 cm) in the region remote from the connector half in order to provide a 50 ohm impedance in the operating frequency range of 1.0 to 1.5 GHz with a microstrip transmission line substrate which is 0.025 inch (0.064 cm) thick alumina. The narrow strip conductor 24 includes a segment 25 which is narrower still and which is 0.005 inch (0.013 cm) wide and 0.180 inch (0.46 cm) long to provide a relatively high impedance (85 ohm) section of microstrip transmission line to compensate for the capacitance of the connector half. Conductor segment 25 extends under the connector body portion 70 in the region of gap 75 to a circular conductive annulus segment 26 having an inner diameter of 0.046 inch (0.117 cm) and an outer diameter of 0.080 inch (0.204 cm). A recess 27 in the substrate 20 having a 0.046 inch (0.117 cm) diameter and a depth of 0.01 inch (0.0254 cm) is registered with the interior periphery of annulus segment 26 to accommodate the end portion (the last 0.010 inch (0.0254 cm)) of inner conductor 82. Inner conductor 82 is soldered to annulus 26 as part of the process of mounting the connector half on the substrate. Two mounting holes 28 having a diameter of 0.073 inch (0.185 cm) are provided in the microstrip transmission line substrate for the passage of conductive bolts 79 for securing the connector half to the microstrip transmission line substrate. These bolts provide an electrical connection between the connector body and the relatively broad ground conductor on the back side of the substrate. This connector system couples the microstrip transmission lines on the two substrates 20 and 30 with a VSWR of less than 1.23:1.0 across the frequency range from 1.2 to 1.4 GHz.

A number of mating connector halves 50/60 are preferably mounted on two microstrip transmission line substrates which are to be mounted face-to-face. These connector halves when engaged and properly seated established a fixed, desired separation of 0.560 inch (1.42 cm) between the face surfaces of the microstrip transmission line substrates.

Other 50 ohm connector portions can be used in the inventive connector half in place of the preferred coaxial connector portions 52 and 62, if desired.

Figure 6:
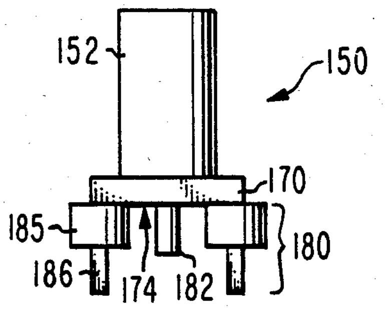
FIG. 6 is an elevation view of an alternative configuration for a connector half in accordance with the present invention.
Figure 7:
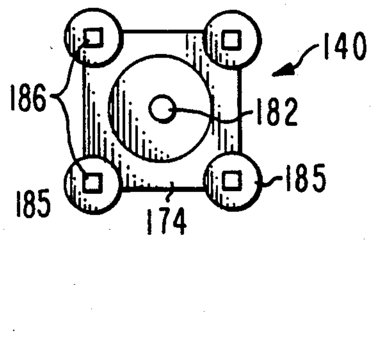
FIG. 7 is a bottom view of the connector half in FIG. 7.

A modified version 140 of the inventive connector half is illustrated in elevation in FIG. 6 and in a bottom view in FIG. 7. Version 140 comprises a male connector half 150 or a female connector half and is based on the commercially available connectors referred to above which are designed for mounting on the back side of the substrate as discussed above in the prior art section of this specification. The coaxial connector portions 152 (male) and female are identical to those discussed above in connection with the preferred connector system. Version 140 has a square body portion 170 which is 0.250 inch (0.635 cm) on a side. Stand-off portion 180 of version 140 has four stand-off legs 186. These legs are preferably 0.130 inch (0.33 cm) long with a 0.050 inch (0.127 cm) square cross section for the 0.075 inch (0.191 cm) closest to the body portion 170 and a 0.031 inch (0.079 cm) square cross section for the rest of the leg. These legs are shorter than the 0.155 inch (0.39 cm) length of the legs of the commercially available connector half. A stand-off distance or gap of 0.075 inch (0.191 cm) between a substrate and the body surface 174 is ensured for this connector half by the use of conductive spacing sleeves 185 which slip over the legs 186. Sleeves 185 have a 0.090 inch (0.229 cm) outer diameter and an inner diameter which forms a firm fit with the legs 186. Sleeves 185 are preferably soldered in place on legs 186 to ensure reliable electrical and mechanical connections between the sleeve 185 and the leg 186. Rather than the two through holes for mounting the connector half to the substrate which are present in the preferred embodiment of this invention, version 140 uses four mounting holes in the substrate. A version 140 connector half is secured to a substrate by soldering each of the legs 186 to the ground conductor on the back side of the substrate and by the solder which holds the inner conductor 182 to the relatively narrow strip conductor. The preferred version of the connector system is preferred over version 140 because its flange and bolt retention scheme ensures that the connection of the connector half to the substrate will not be impaired by attempts to disengage the intermeshed connector halves. The solder-only retention system of version 140 is potentially less reliable. Other modifications to this invention can be made without departing from the scope of the invention as defined in the appended claims.

What is claimed is:

1. A connector half for coupling microwave signals between a mating coaxial connector half and a strip transmission line of the type having a dielectric substrate with a relatively narrow strip conductor on a face side thereof and a relatively broad ground conductor on a back side thereof, said connector half comprising:

a body portion having a conductive outer portion and an aperture therethrough;

a coaxial connector portion adjacent to one side of said body portion, said coaxial connector portion including a linear inner conductor and an outer conductor which is electrically continuous with said conductive outer portion;

said linear inner conductor extending linearly from within said coaxial connector portion through said aperture and beyond said body portion without contacting said conductive outer portion for making electrical contact with said narrow strip conductor on said substrate, when said connector half is mounted on said face side of said strip transmission line substrate; and a stand-off portion adjacent to a second, opposite, side of said body portion for, when positioned over said strip transmission line, spacing said body portion a predetermined distance from said strip transmission line substrate, said stand-off portion being configured with a gap through which said inner conductor extends and within which said relatively narrow strip conductor mat, while spaced from said stand-off portion, extend between said body portion and said strip transmission line substrate to be in electrical contact with said inner conductor, said stand-off portion of a material and configured in the region about said gap to form an intermediate RF transmission line with said linear extension of said inner conductor to match the characteristic impedance of said coaxial connector portion and the characteristic impedance of said strip transmission line structure;

said body portion and said stand-off portion together configured to provide an electrical connection between said outer conductor and said relatively broad ground conductor, when said connector half is mounted on said face side of said strip transmission line substrate;

said stand-off portion including an electrically conductive surface bordering a portion of said gap and extending from said body portion for substantially said predetermined distance, said electrically conductive surface being serpentine and including a central portion which is concave toward said inner conductor and end portions which are convex toward said inner conductor.

2. The connector half recited in claim 1 wherein:

said first recited connector half is mounted on said face side of a first strip transmission line; and a second, mating connector half is mounted on said face side of a second strip transmission line; and said first and second connector halves have their coaxial connector portions fully meshed.

3. The connector half recited in claim 1 wherein:

said conductive outer portion is electrically continuous with said conductive surface of said stand-off portion; and a solid dielectric body is disposed in said aperture in said body portion for spacing said inner conductor from said conductive outer portion.

4. The connector half recited in claim 3 wherein:

said outer conductor of said coaxial connector portion, said conductive outer portion, and said conductive portion of said stand-off portion comprise an integral body.

5. A connector half for coupling microwave signals between a mating coaxial connector half and a strip transmission line of the type having a dielectric substrate with a relatively narrow strip conductor on a face side thereof and a relatively broad ground conductor on a back side thereof, said connector half comprising:

a body portion having a conductive outer portion and an aperture therethrough;

a coaxial connector portion adjacent to one side of said body portion, said coaxial connector portion including a linear inner conductor and an outer conductor which is electrically continuous with said conductive outer portion;

said linear inner conductor extending linearly from within said coaxial connector portion through said aperture and beyond said body portion without contacting said conductive outer portion for making electrical contact with said narrow strip conductor on said substrate, when said connector half is mounted on said face side of said strip transmission line substrate; and a stand-off portion adjacent to a second, opposite, side of said body portion for, when positioned over said strip transmission line, spacing said body portion a predetermined distance from said strip transmission line substrate, said stand-off portion being configured with a gap through which said inner conductor extends and within which said relatively narrow strip conductor may, while spaced from said stand-off portion, extend between said body portion and said strip transmission line substrate to be in electrical contact with said inner conductor, said stand-off portion of a material and configured in the region about said gap to form an intermediate RF transmission line with said linear extension of said inner conductor to match the characteristic impedance of said coaxial connector portion and the characteristic impedance of said strip transmission line structure;

said body portion and said stand-off portion together configured to provide an electrical connection between said outer conductor and said relatively broad ground conductor, when said connector half is mounted on said face side of said strip transmission line substrate;

said stand-off portion including leg members having conductive spacing sleeves disposed thereon.

6. A connector system for connecting, in a face-to-face spaced relation, and for coupling microwave signals between first and second strip transmission lines each of the type having a substrate with a relatively narrow strip conductor on a face side thereof and a relatively broad ground conductor on a back side thereof, said connector system comprising:

first and second mating connector halves connected together;

each of said first and second connector halves including:

a body portion having a conductive outer portion and an aperture therethrough;

a coaxial connector portion adjacent to one side of said body portion, said coaxial portion including a linear inner conductor and an outer conductor which is electrically continuous with said conductive outer portion;

said linear inner conductor extending linearly from within said coaxial connector portion through said aperture and beyond said body portion without contacting said conductive outer portion and electrically connected to said relatively narrow strip conductor; and a stand-off portion extending from a second, opposite, side of said body portion to said substrate and having a substrate contact surface disposed substantially perpendicular to said linear inner conductor and in contact with said substrate for spacing said body portion a predetermined distance from said substrate, said stand-off portion being configured with a gap through which said inner conductor extends and within which said relatively narrow strip conductor, while spaced from said stand-off portion, extends between said body portion and said strip transmission line substrate into electrical contact with said inner conductor, said stand-off portion of a material and configured in the region about said gap to form an intermediate RF transmission line with said linear extension of said inner conductor to match the characteristic impedance of said coaxial connector portion and the characteristic impedance of said strip transmission line structure;

said body portion and said stand-off portion together configured to provide an electrical connection between said body portion and said relatively broad ground conductor;

said stand-off portion including first and second legs each extending from said body portion into contact with said face side of said substrate; and said legs including conductive surfaces at the boundary of a portion of said gap and contoured to include near-to-the-inner-conductor portions and far-from-the-inner-conductor portions configured for aiding in the provision of an electrical impedance match between said connector half and said strip transmission line.

7. The connector system recited in claim 6 wherein:

said conductive outer portion is electrically continuous with said conductive leg surfaces of said stand-off portion; and a solid dielectric body is disposed in said aperture in said body portion for spacing said inner conductor from said conductive outer portion.

8. The connector system recited in claim 7 wherein: said outer conductor of said coaxial connector portion, said conductive outer portion, and said conductive surfaces of said stand-off portion comprise an integral body.

9. The connector system recited in claim 6 wherein: said first connector half is mounted on said face side of said first strip transmission line substrate; and said second connector half is mounted on said face side of said second strip transmission line substrate.

10. The connector system recited in claim 9 wherein: in the vicinity of said connector half, said relatively narrow strip conductor is configured for aiding in establishing an electrical impedance match between said connector half and said strip transmission line.

11. The connector system recited in claim 10 wherein:

said relatively narrow strip conductor configuration includes a relatively narrower segment and a segment having a substantially circular outer periphery; and said inner conductor of said connector half is substantially centered with respect to said circular segment.

12. The connector system recited in claim 11 wherein:

said circular conductor segment is an annulus having an aperture therein and said substrate has a recess therein subjacent said aperture in said annulus; and said inner conductor extends into said recess in said substrate and is soldered to said annulus.

* * * * *